(12) United States Patent
Qian et al.

(10) Patent No.: US 9,064,806 B1
(45) Date of Patent: Jun. 23, 2015

(54) SOFT AND CONDITIONABLE CHEMICAL MECHANICAL POLISHING PAD WITH WINDOW

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Marty W. DeGroot, Middletown, DE (US); Michelle Jensen, Newark, DE (US); James Murnane, Norristown, PA (US); Jeffrey J. Hendron, Elkton, MD (US); John G. Nowland, Elkton, MD (US); David B. James, Newark, DE (US); Fengji Yeh, Wilmington, DE (US)

(73) Assignees: Rohm and Haas Electronics Materials CMP Holdings, Inc., Newark, DE (US); Dow Global Technologies LLC, Midland, MI (US)

( * ) Notice: Subject to any disclaimer, the term of this patent is extended or adjusted under 35 U.S.C. 154(b) by 0 days.

(21) Appl. No.: 14/228,744

(22) Filed: Mar. 28, 2014

(51) Int. Cl.
 *H01L 21/302* (2006.01)
 *H01L 21/304* (2006.01)
 *B24B 37/22* (2012.01)

(52) U.S. Cl.
 CPC .............. *H01L 21/304* (2013.01); *B24B 37/22* (2013.01)

(58) Field of Classification Search
 CPC ................ H01L 21/304; H01L 21/306; H01L 21/30625; H01L 21/3212; B24B 37/12; B24B 37/14; B24B 37/20; B24B 37/205; B24B 37/22
 USPC ............................ 438/459, 690, 691, 692, 693
 See application file for complete search history.

(56) References Cited

U.S. PATENT DOCUMENTS

| | | | |
|---|---|---|---|
| 6,171,181 | B1 | 1/2001 | Roberts et al. |
| 6,984,163 | B2 | 1/2006 | Roberts |
| 7,018,581 | B2 | 3/2006 | David et al. |
| 7,195,539 | B2 | 3/2007 | Turner et al. |
| 7,204,742 | B2 * | 4/2007 | Prasad ........................... 451/41 |
| 7,258,602 | B2 | 8/2007 | Shih et al. |
| 7,874,894 | B2 | 1/2011 | Fukuda et al. |

(Continued)

OTHER PUBLICATIONS

Copending U.S. Appl. No. 14/228,613.

(Continued)

*Primary Examiner* — Kevin M Picardat
(74) *Attorney, Agent, or Firm* — Thomas S. Deibert

(57) ABSTRACT

A chemical mechanical polishing pad is provided having a polishing layer; and a window incorporated into the polishing layer; wherein the polishing layer comprises a reaction product of ingredients, including: a polishing layer prepolymer and a polishing layer curative system; wherein the polishing layer curative system includes a polishing layer amine initiated polyol curative, a polishing layer high molecular weight polyol curative and a polishing layer difunctional curative; and, wherein the window comprises a reaction product of ingredients, including: a window prepolymer and a window curative system; wherein the window curative system includes a window difunctional curative, a window amine initiated polyol curative and a window high molecular weight polyol curative; and, wherein the polishing layer exhibits a density of $\geq 0.6$ g/cm$^3$; a Shore D hardness of 5 to 40; an elongation to break of 100 to 450%; and, a cut rate of 25 to 150 μm/hr.

11 Claims, 6 Drawing Sheets

(56) References Cited

U.S. PATENT DOCUMENTS

| | | |
|---|---|---|
| 7,927,183 B2 | 4/2011 | Fukuda et al. |
| 8,075,372 B2 * | 12/2011 | Prasad .............................. 451/59 |
| 8,257,544 B2 | 9/2012 | Kulp et al. |
| 8,257,545 B2 | 9/2012 | Loyack et al. |
| 8,431,489 B2 | 4/2013 | Kulp et al. |
| 8,512,427 B2 | 8/2013 | Xie et al. |
| 2003/0171081 A1 | 9/2003 | Komukai et al. |
| 2008/0207100 A1 * | 8/2008 | Roy et al. ....................... 451/529 |
| 2010/0227533 A1 * | 9/2010 | Kulp et al. ....................... 451/41 |

OTHER PUBLICATIONS

Copending U.S. Appl. No. 14/228,660.
Copending U.S. Appl. No. 13/906,715.
Copending U.S. Appl. No. 13/906,765.
Copending U.S. Appl. No. 13/906,825.

\* cited by examiner

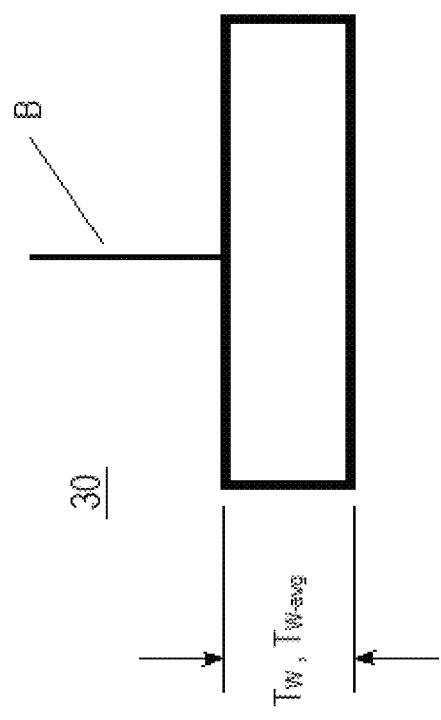

SOFT AND CONDITIONABLE CHEMICAL MECHANICAL POLISHING PAD WITH WINDOW

The present invention relates to chemical mechanical polishing pads and methods of making and using the same. More particularly, the present invention relates to a chemical mechanical polishing pad comprising a polishing layer and an endpoint detection window incorporated into the polishing layer, wherein the polishing layer exhibits a density of greater than 0.6 g/cm$^3$; a Shore D hardness of 5 to 40; an elongation to break of 100 to 450%; and, a cut rate of 25 to 150 µm/hr; and, wherein the polishing layer has a polishing surface adapted for polishing the substrate.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others. Common removal techniques include wet and dry isotropic and anisotropic etching, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. To effect polishing, the polishing pad and wafer typically rotate relative to one another. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

Pad surface "conditioning" or "dressing" is critical to maintain a consistent polishing surface for stable polishing performance. Over time the polishing surface of the polishing pad wears down, smoothing over the microtexture of the polishing surface—a phenomenon called "glazing". Polishing pad conditioning is typically achieved by abrading the polishing surface mechanically with a conditioning disk. The conditioning disk has a rough conditioning surface typically comprised of embedded diamond points. The conditioning disk is brought into contact with the polishing surface either during intermittent breaks in the CMP process when polishing is paused ("ex situ"), or while the CMP process is underway ("in situ"). Typically the conditioning disk is rotated in a position that is fixed with respect to the axis of rotation of the polishing pad, and sweeps out an annular conditioning region as the polishing pad is rotated. The conditioning process as described cuts microscopic furrows into the pad surface, both abrading and plowing the pad material and renewing the polishing texture.

Semiconductor devices are becoming increasingly complex with finer features and more metallization layers. This trend requires improved performance from polishing consumables in order to maintain planarity and limit polishing defects. The latter can create electrical breaks or shorts of the conducting lines that would render the semiconductor device non-functional. It is generally known that one approach to reduce polishing defects, such as micro-scratches or chatter marks, is to use a softer polishing pad.

A family of soft polyurethane polishing layers are disclosed by James, et al. in U.S. Pat. No. 7,074,115. James et al. discloses a polishing pad comprising a the reaction product of an isocyanate-terminated urethane prepolymer with an aromatic diamine or polyamine curative, wherein the reaction product exhibits a porosity of at least 0.1 volume percent, a KEL energy loss factor at 40° C. and a 1 rad/sec of 385 to 750 l/Pa, and a modulus E at 40° C. and 1 rad/sec of 100 to 400 MPa.

As described above, it is necessary to diamond condition the surface of chemical mechanical polishing pads to create a favorable microtexture for optimum polishing performance. However, it is difficult to create such texture in conventional polishing layer materials, such as those described by James et al., because these materials exhibit a high ductility, as measured by tensile elongation to break values. As a result, when these materials are subjected to conditioning with a diamond conditioning disk, rather than cutting furrows into the pad's surface, the diamonds in the conditioning disk simply push the pad material aside without cutting. Hence, very little texture is created in the surface of these conventional materials as a result of conditioning with a diamond conditioning disk.

Another related problem with these conventional chemical mechanical polishing pad materials arises during the machining process to form macro groove patterns in the pad surface. Conventional chemical mechanical polishing pads are typically provided with a groove pattern cut into their polishing surface to promote slurry flow and to remove polishing debris from the pad-wafer interface. Such grooves are frequently cut into the polishing surface of the polishing pad either using a lathe or by a CNC milling machine. With soft pad materials, however, a similar problem to that of diamond conditioning occurs, such that after the cutting bit has passed, the pad material simply rebounds and the grooves formed close in on themselves. Thus groove quality is poor and it is more difficult to successfully manufacture commercially acceptable pads with such soft materials. This problem worsens as the hardness of the pad material decreases.

Another challenge presented with chemical mechanical polishing is determining when the substrate has been polished to the desired extent. In situ methods for determining polishing endpoints have been developed. The in situ optical end pointing techniques can be divided into two basic categories: (1) monitoring the reflected optical signal at a single wavelength or (2) monitoring the reflected optical signal from multiple wavelengths. Typical wavelengths used for optical end pointing include those in the visible spectrum (e.g., 400 to 700 nm), the ultraviolet spectrum (315 to 400 nm), and the infrared spectrum (e.g., 700 to 1000 nm). In U.S. Pat. No. 5,433,651, Lustig et al disclosed a polymeric endpoint detection method using a single wavelength in which light from a laser source is transmitted on a wafer surface and the reflected signal is monitored. As the composition at the wafer surface changes from one metal to another, the reflectivity changes. This change in reflectivity is then used to detect the polishing endpoint. In U.S. Pat. No. 6,106,662, Bibby et al disclosed using a spectrometer to acquire an intensity spectrum of reflected light in the visible range of the optical spectrum. In metal CMP applications, Bibby et al. teach using the whole spectrum to detect the polishing endpoint.

To accommodate these optical end pointing techniques, chemical mechanical polishing pads have been developed having windows. For example, in U.S. Pat. No. 5,605,760, Roberts discloses a polishing pad wherein at least a portion of the pad is transparent to laser light over a range of wavelengths. In some of the disclosed embodiments, Roberts teaches a polishing pad that includes a transparent window piece in an otherwise opaque pad. The window piece may be a rod or plug of transparent polymer in a molded polishing pad. The rod or plug may be insert molded within the polishing pad (i.e., an "integral window"), or may be installed into a cut out in the polishing pad after the molding operation (i.e., a "plug in place window").

Aliphatic isocyanate based polyurethane materials, such as those described in U.S. Pat. No. 6,984,163 provided improved light transmission over a broad light spectrum. Unfortunately, these aliphatic polyurethane windows, inter alia, tend to lack the requisite durability required for demanding polishing applications.

Conventional polymer based endpoint detection windows often exhibit undesirable degradation upon exposure to light having a wavelength of 330 to 425 nm. Increasingly, however, there is pressure to utilize light with shorter wavelengths for endpoint detection purposes in semiconductor polishing applications to facilitate thinner material layers and smaller device sizes.

In addition, semiconductor devices are becoming increasingly complex with finer features and more metallization layers. This trend requires improved performance from polishing consumables in order to maintain planarity and limit polishing defects. The latter can create electrical breaks or shorts of the conducting lines that would render the semiconductor device non-functional. It is generally known that one approach to reduce polishing defects, such as micro-scratches or chatter marks, is to use a softer polishing layer material. Accordingly, there is a trend toward using softer polishing layer materials to facilitate improved defectivity performance. Notwithstanding, conventional window formulations do not pair well with such softer polishing layer materials, tending to lead to an increase in polishing defectivity.

Accordingly, there is a continuing need for chemical mechanical polishing pads that provide a physical property profile that correlates well with that associated with low defect formulations, but which also imparts enhanced conditionability to the polishing layer (i.e., exhibits a cut rate of 25 to 150 μm/hr) and for improved polymeric endpoint detection window formulations for use in such chemical mechanical polishing pads. In particular, there is a continuing need for polymeric endpoint detection window formulations exhibiting a hardness of ≤50 Shore D, coupled with an elongation to break of ≤400%; wherein the window formulations do not exhibit undesirable window deformation and have the required durability for demanding polishing applications.

The present invention provides a chemical mechanical polishing pad, comprising: a polishing layer having a polishing surface, a base surface and an average thickness, $T_{P\text{-}avg}$, measured in a direction perpendicular to the polishing surface from the polishing surface to the base surface; and, an endpoint detection window incorporated into the polishing layer; wherein the polishing layer comprises a reaction product of ingredients, comprising: a polishing layer prepolymer, wherein the polishing layer prepolymer is selected from the group consisting of isocyanate terminated urethane prepolymers having 2 to 12 wt % unreacted NCO groups; and, a polishing layer curative system, comprising: at least 5 wt % of a polishing layer amine initiated polyol curative having at least one nitrogen atom per molecule and an average of at least three hydroxyl groups per molecule; 25 to 95 wt % of a polishing layer high molecular weight polyol curative having a number average molecular weight, $M_N$, of 2,500 to 100,000 and an average of three to ten hydroxyl groups per molecule; and, 0 to 70 wt % of a polishing layer difunctional curative; wherein the endpoint detection window comprises a reaction product of ingredients, comprising: a window prepolymer, wherein the window prepolymer is selected from the group consisting of isocyanate terminated urethane prepolymers having 2 to 6.5 wt % unreacted NCO groups; and, a window curative system, comprising: at least 5 wt % of a window difunctional curative; at least 5 wt % of a window amine initiated polyol curative having at least one nitrogen atom per molecule and an average of at least three hydroxyl groups per molecule; and, 25 to 90 wt % of a window high molecular weight polyol curative having a number average molecular weight, $M_N$, of 2,000 to 100,000 and an average of three to ten hydroxyl groups per molecule; wherein the polishing layer exhibits a density of ≥0.6 g/cm$^3$; a Shore D hardness of 5 to 40; an elongation to break of 100 to 450%; and, a cut rate of 25 to 150 μm/hr.

The present invention provides a chemical mechanical polishing pad, comprising: a polishing layer having a polishing surface, a base surface and an average thickness, $T_{P\text{-}avg}$, measured in a direction perpendicular to the polishing surface from the polishing surface to the base surface; an endpoint detection window incorporated into the polishing layer; a rigid layer having a top surface and a bottom surface; and, a hot melt adhesive interposed between the base surface of the polishing layer and the top surface of the rigid layer; wherein the hot melt adhesive bonds the polishing layer to the rigid layer; wherein the polishing layer comprises a reaction product of ingredients, comprising: a polishing layer prepolymer, wherein the polishing layer prepolymer is selected from the group consisting of isocyanate terminated urethane prepolymers having 2 to 12 wt % unreacted NCO groups; and, a polishing layer curative system, comprising: at least 5 wt % of a polishing layer amine initiated polyol curative having at least one nitrogen atom per molecule and an average of at least three hydroxyl groups per molecule; 25 to 95 wt % of a polishing layer high molecular weight polyol curative having a number average molecular weight, $M_N$, of 2,500 to 100,000 and an average of three to ten hydroxyl groups per molecule; and, 0 to 70 wt % of a polishing layer difunctional curative; wherein the endpoint detection window comprises a reaction product of ingredients, comprising: a window prepolymer, wherein the window prepolymer is selected from the group consisting of isocyanate terminated urethane prepolymers having 2 to 6.5 wt % unreacted NCO groups; and, a window curative system, comprising: at least 5 wt % of a window difunctional curative; at least 5 wt % of a window amine initiated polyol curative having at least one nitrogen atom per molecule and an average of at least three hydroxyl groups per molecule; and, 25 to 90 wt % of a window high molecular weight polyol curative having a number average molecular weight, $M_N$, of 2,000 to 100,000 and an average of three to ten hydroxyl groups per molecule; wherein the polishing layer exhibits a density of ≥0.6 g/cm$^3$; a Shore D hardness of 5 to 40; an elongation to break of 100 to 450%; and, a cut rate of 25 to 150 µm/hr.

The present invention provides a chemical mechanical polishing pad, comprising: a polishing layer having a polishing surface, a base surface and an average thickness, $T_{P\text{-}avg}$, measured in a direction perpendicular to the polishing surface from the polishing surface to the base surface; an endpoint detection window incorporated into the polishing layer; a rigid layer having a top surface and a bottom surface; a hot melt adhesive interposed between the base surface of the polishing layer and the top surface of the rigid layer; a pressure sensitive platen adhesive; wherein the pressure sensitive platen adhesive is disposed on the bottom surface of the rigid; and, a release liner; wherein the hot melt adhesive bonds the polishing layer to the rigid layer; wherein the pressure sensitive platen adhesive is interposed between the bottom surface of the rigid layer and the release liner; wherein the polishing layer comprises a reaction product of ingredients, comprising: a polishing layer prepolymer, wherein the polishing layer prepolymer is selected from the group consisting of isocyanate terminated urethane prepolymers having 2 to 12 wt % unreacted NCO groups; and, a polishing layer curative system, comprising: at least 5 wt % of a polishing layer amine initiated polyol curative having at least one nitrogen atom per molecule and an average of at least three hydroxyl groups per molecule; 25 to 95 wt % of a polishing layer high molecular weight polyol curative having a number average molecular weight, $M_N$, of 2,500 to 100,000 and an average of three to ten hydroxyl groups per molecule; and, 0 to 70 wt % of a polishing layer difunctional curative; wherein the endpoint detection window comprises a reaction product of ingredients, comprising: a window prepolymer, wherein the window prepolymer is selected from the group consisting of isocyanate terminated urethane prepolymers having 2 to 6.5 wt % unreacted NCO groups; and, a window curative system, comprising: at least 5 wt % of a window difunctional curative; at least 5 wt % of a window amine initiated polyol curative having at least one nitrogen atom per molecule and an average of at least three hydroxyl groups per molecule; and, 25 to 90 wt % of a window high molecular weight polyol curative having a number average molecular weight, $M_N$, of 2,000 to 100,000 and an average of three to ten hydroxyl groups per molecule; wherein the polishing layer exhibits a density of ≥0.6 g/cm$^3$; a Shore D hardness of 5 to 40; an elongation to break of 100 to 450%; and, a cut rate of 25 to 150 µm/hr.

The present invention provides a chemical mechanical polishing pad, comprising: a polishing layer having a polishing surface, a base surface and an average thickness, $T_{P\text{-}avg}$, measured in a direction perpendicular to the polishing surface from the polishing surface to the base surface; and, an endpoint detection window incorporated into the polishing layer; wherein the polishing layer comprises a reaction product of ingredients, comprising: a polishing layer prepolymer, wherein the polishing layer prepolymer is selected from the group consisting of isocyanate terminated urethane prepolymers having 2 to 12 wt % unreacted NCO groups; and, a polishing layer curative system, comprising: at least 5 wt % of a polishing layer amine initiated polyol curative having at least one nitrogen atom per molecule and an average of at least three hydroxyl groups per molecule; 25 to 95 wt % of a polishing layer high molecular weight polyol curative having a number average molecular weight, $M_N$, of 2,500 to 100,000 and an average of three to ten hydroxyl groups per molecule; and, 0 to 70 wt % of a polishing layer difunctional curative; wherein the endpoint detection window comprises a reaction product of ingredients, comprising: a window prepolymer, wherein the window prepolymer is selected from the group consisting of isocyanate terminated urethane prepolymers having 2 to 6.5 wt % unreacted NCO groups; and, a window curative system, comprising: at least 5 wt % of a window difunctional curative; at least 5 wt % of a window amine initiated polyol curative having at least one nitrogen atom per molecule and an average of at least three hydroxyl groups per molecule; and, 25 to 90 wt % of a window high molecular weight polyol curative having a number average molecular weight, $M_N$, of 2,000 to 100,000 and an average of three to ten hydroxyl groups per molecule; wherein the polishing layer exhibits a density of ≥0.6 g/cm$^3$; a Shore D hardness of 5 to 40; an elongation to break of 100 to 450%; and, a cut rate of 25 to 150 µm/hr; and, wherein the endpoint detection window exhibits a density of ≥1 g/cm$^3$; a porosity of less than 0.1 vol %; a Shore D hardness of 10 to 50; an elongation to break of ≤400%; and, a double pass transmission at 800 nm, $DPT_{800}$, of 50 to 100%.

The present invention provides a chemical mechanical polishing pad, comprising: a polishing layer having a polishing surface, a base surface and an average thickness, $T_{P\text{-}avg}$, measured in a direction perpendicular to the polishing surface from the polishing surface to the base surface; and, an endpoint detection window incorporated into the polishing layer; wherein the polishing layer comprises a reaction product of ingredients, comprising: a polishing layer prepolymer, wherein the polishing layer prepolymer is selected from the group consisting of isocyanate terminated urethane prepolymers having 2 to 12 wt % unreacted NCO groups; and, a polishing layer curative system, comprising: at least 5 wt % of a polishing layer amine initiated polyol curative having at least one nitrogen atom per molecule and an average of at least three hydroxyl groups per molecule; 25 to 95 wt % of a polishing layer high molecular weight polyol curative having a number average molecular weight, $M_N$, of 2,500 to 100,000 and an average of three to ten hydroxyl groups per molecule; and, 0 to 70 wt % of a polishing layer difunctional curative; wherein the endpoint detection window comprises a reaction product of ingredients, comprising: a window prepolymer, wherein the window prepolymer is selected from the group consisting of isocyanate terminated urethane prepolymers having 2 to 6.5 wt % unreacted NCO groups; and, a window curative system, comprising: at least 5 wt % of a window difunctional curative; at least 5 wt % of a window amine initiated polyol curative having at least one nitrogen atom per molecule and an average of at least three hydroxyl groups per molecule; and, 25 to 90 wt % of a window high molecular weight polyol curative having a number average molecular weight, $M_N$, of 2,000 to 100,000 and an average of three to ten hydroxyl groups per molecule; wherein the polishing layer exhibits a density of ≥0.6 g/cm$^3$; a Shore D hardness of 5 to 40; an elongation to break of 100 to 450%; and, a cut rate of 25 to 150 µm/hr; and, wherein the endpoint detection window exhibits a density of ≥1 g/cm$^3$; a porosity of less than 0.1 vol %; a Shore D hardness of 10 to 50; an elongation to break of ≤400%; a double pass transmission at 800 nm, $DPT_{800}$, of 50 to 100%; and, a double pass transmission at 400 nm, $DPT_{400}$, of 25 to 100%.

The present invention provides a method of polishing a substrate, comprising: providing a chemical mechanical polishing apparatus having a platen, a light source and a photosensor; providing at least one substrate; providing a chemical mechanical polishing pad according to the present invention; installing onto the platen the chemical mechanical polishing pad; optionally, providing a polishing medium at an interface between the polishing surface and the substrate; creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor.

BRIEF DESCRIPTION OF THE DRAWINGS

FIG. 6 is a side elevational view of an endpoint detection window.

DETAILED DESCRIPTION

The chemical mechanical polishing pad of the present invention has a polishing layer that exhibits a unique combination of low hardness (i.e., Shore D≤40) to provide low defect polishing performance and a low tensile elongation (i.e., elongation to break ≤450%) which provides both machinability to facilitate the formation of grooves in the polishing layer and conditionability to facilitate the formation of microtexture using a diamond conditioning disk. In addition, the balance of properties enabled by the polishing layer of the present invention provides the ability to, for example, polish semiconductor wafers without damaging the wafer surface by creating micro-scratch defects that could compromise the electrical integrity of the semiconductor device.

The chemical mechanical polishing pad of the present invention also has an endpoint detection window incorporated into the polishing layer that exhibits a unique combination of low hardness (i.e., Shore D≤50) to provide low defect polishing performance and a low tensile elongation (i.e., elongation to break ≤400%) coupled with good optical properties to facilitate polishing end point detection; wherein the endpoint detection window formulation does not exhibit undesirable window deformation (i.e., excessive bulging or sagging) and has the required durability for demanding polishing applications.

Figure 1:
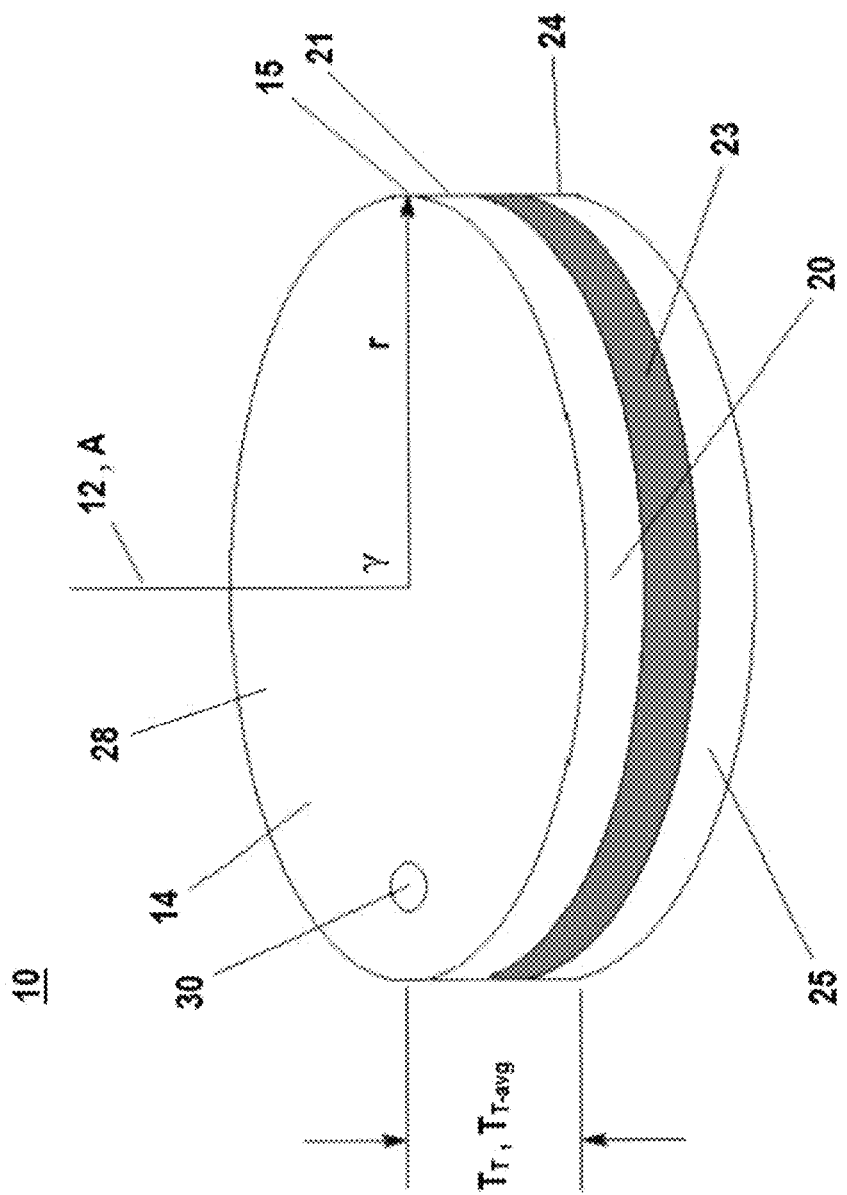
FIG. 1 is a depiction of a perspective view of a chemical mechanical polishing pad of the present invention.
Figure 2:
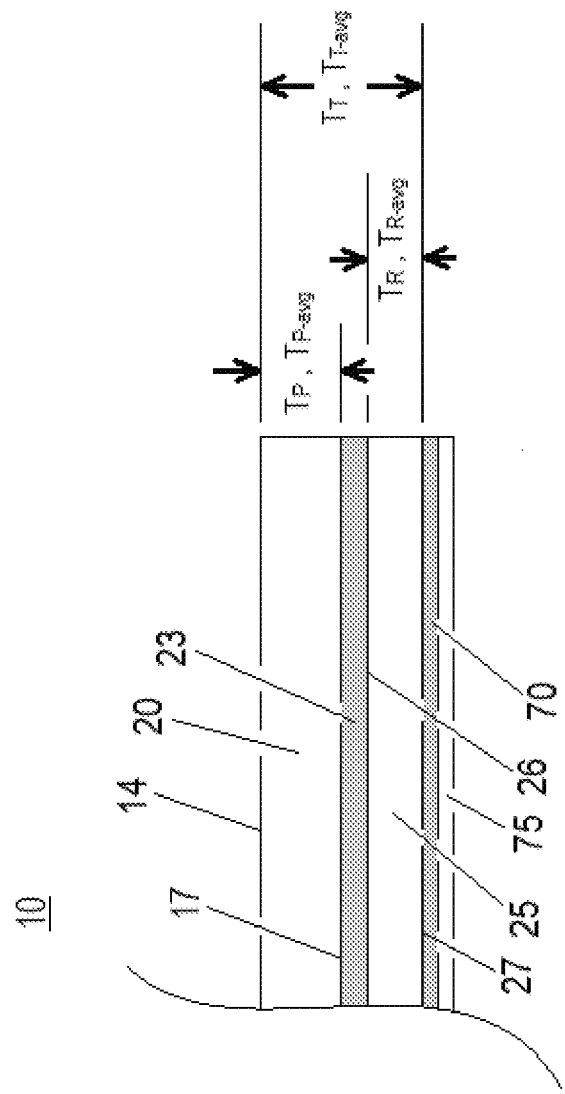
FIG. 2 is a depiction of a cross sectional cut away view of a chemical mechanical polishing pad of the present invention.
Figure 3:
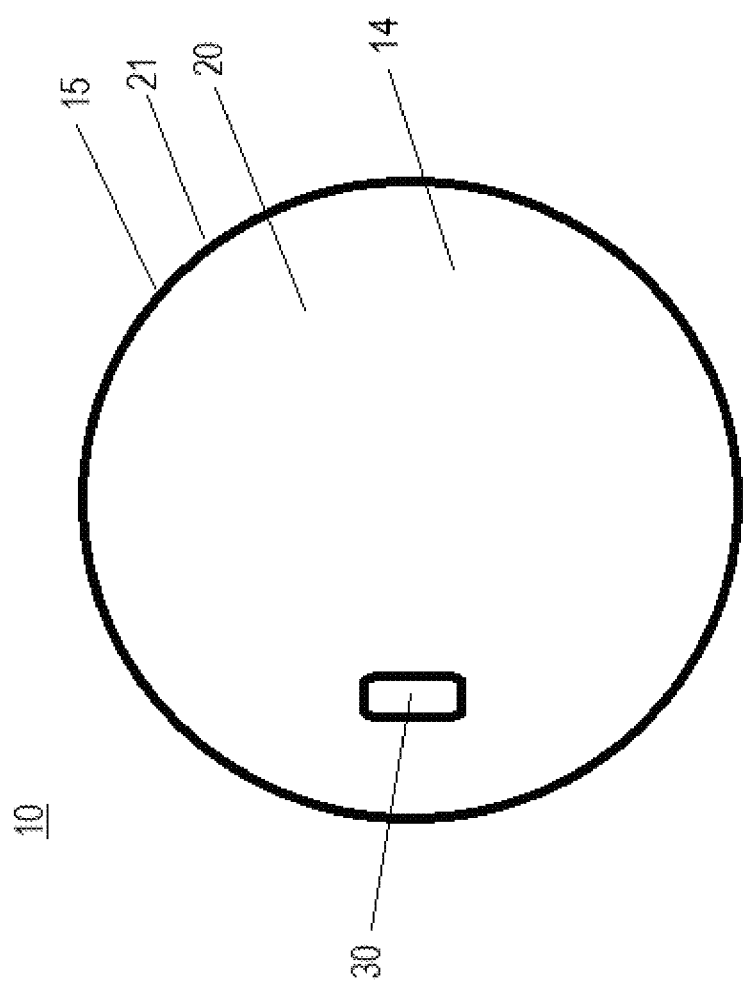
FIG. 3 is a top plan view of a chemical mechanical polishing pad of the present invention.
Figure 4:
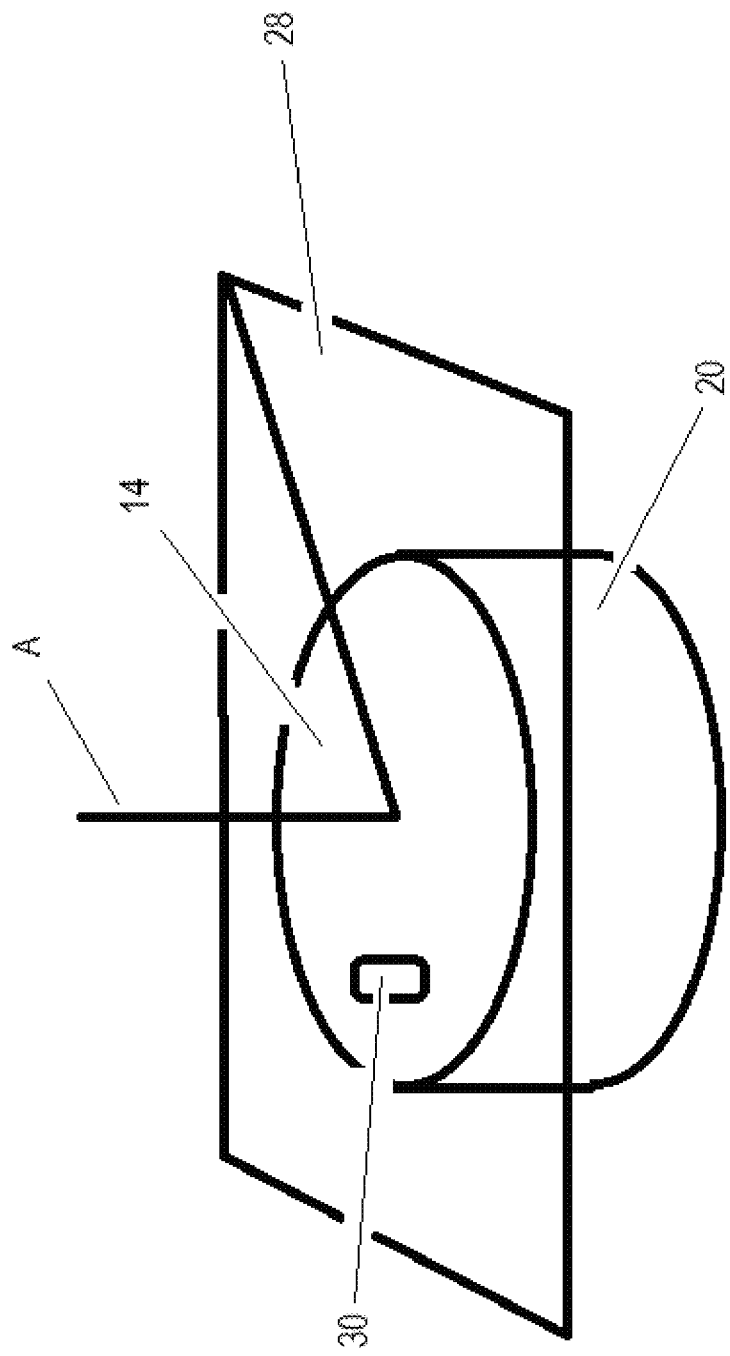
FIG. 4 is a side perspective view of a polishing layer of the present invention.
Figure 5:
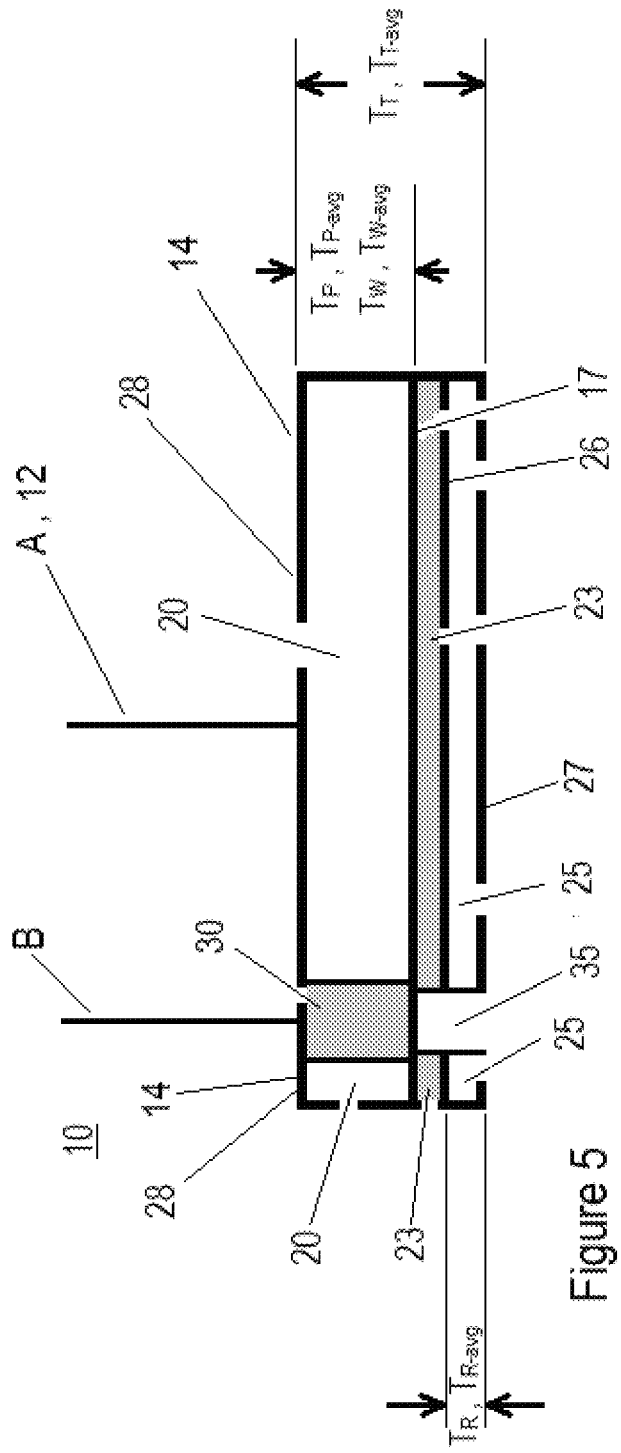
FIG. 5 is a side elevational view of a cross section of a chemical mechanical polishing pad of the present invention with an integral endpoint detection window incorporated into the polishing layer.

The term "average total thickness, $T_{T\text{-}avg}$" as used herein and in the appended claims in reference to a chemical mechanical polishing pad (10) having a polishing surface (14) means the average thickness, $T_T$, of the chemical mechanical polishing pad measured in a direction normal to the polishing surface (14) from the polishing surface (14) to the bottom surface (27) of the rigid layer (25). (See FIGS. 1, 2 and 5).

The term "substantially circular cross section" as used herein and in the appended claims in reference to a chemical mechanical polishing pad (10) means that the longest radius, r, of the cross section from the central axis (12) to the outer perimeter (15) of the polishing surface (14) of the polishing layer (20) is ≤20% longer than the shortest radius, r, of the cross section from the central axis (12) to the outer perimeter (15) of the polishing surface (14). (See FIG. 1).

The term "polishing medium" as used herein and in the appended claims encompasses particle containing polishing solutions and non-particle-containing polishing solutions, such as abrasive free and reactive liquid polishing solutions.

The term "double pass transmission" or "DPT" as used herein and in the appended claims in reference to an endpoint detection window is determined using the following equation:

$$DPT=(IW_{Si}-IW_D)\div(IA_{Si}-IA_D)$$

wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light through the thickness, $T_W$, of the window (see FIGS. 5-6) and measuring at the point of origin the intensity of light reflected back through the thickness of the window, $T_W$, from a surface positioned against a second face of the endpoint detection window substantially parallel to the first face; wherein $IW_{Si}$ is a measurement of the intensity of light that passes through the window from the point of origin and reflects off the surface of a silicon blanket wafer placed against a second face of the window back through the window to the point of origin; wherein $IW_D$ is a measurement of the intensity of light that passes from the point of origin through the window and reflects off the surface of a black body and back through the window to the point of origin; wherein $IA_{Si}$ is a measurement of the intensity of light that passes from the point of origin through a thickness of air equivalent to the thickness, $T_W$, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light reflected off a black body at the light emitting surface of the 3 mm fiber optic cable.

The term "$DPT_{400}$" as used herein and in the appended claims is the DPT exhibited by an endpoint detection window for light having a wavelength of 400 nm.

The term "$DPT_{800}$" as used herein and in the appended claims is the DPT exhibited by an endpoint detection window for light having a wavelength of 800 nm.

The chemical mechanical polishing pad (10) of the present invention is preferably adapted for rotation about a central axis (12). (See FIG. 1). Preferably, the polishing surface (14) of polishing layer (20) is in a plane (28) perpendicular to the central axis (12). The chemical mechanical polishing pad (10) is optionally adapted for rotation in a plane (28) that is at an angle, γ, of 85 to 95° to the central axis (12), preferably, of 90° to the central axis (12). Preferably, the polishing layer (20) has a polishing surface (14) that has a substantially circular cross section perpendicular to the central axis (12). Preferably, the radius, r, of the cross section of the polishing surface (14) perpendicular to the central axis (12) varies by ≤20% for the cross section, more preferably by ≤10% for the cross section.

The chemical mechanical polishing pad (10) of the present invention is preferably designed to facilitate the polishing of a substrate selected from at least one of a magnetic substrate, an optical substrate and a semiconductor substrate.

The chemical mechanical polishing pad (10) has a polishing layer (20) that exhibits a unique combination of low hardness (i.e., Shore D≤40) to provide low defect polishing performance and a low tensile elongation (i.e., elongation to break ≤450%) which provides both machinability to facilitate the formation of grooves in the polishing layer and conditionability to facilitate the formation of microtexture using a diamond conditioning disk. In addition, the balance of properties enabled by the polishing layer of the present invention provides the ability to, for example, polish semiconductor wafers without damaging the wafer surface by creating micro-scratch defects that could compromise the electrical integrity of the semiconductor device.

The chemical mechanical polishing pad (10) of the present invention, comprises (preferably, consists of): a polishing layer (20) having a polishing surface (14), a base surface (17) and an average thickness, $T_{P\text{-}avg}$, measured in a direction perpendicular to the polishing surface (14) from the polishing surface (14) to the base surface (17); an endpoint detection window (30) incorporated into the polishing layer (preferably, wherein the endpoint detection window facilitates in situ polishing endpoint detection); optionally, a rigid layer (25) having a top surface (26) and a bottom surface (27); optionally, a hot melt adhesive (23) interposed between the base surface (17) of the polishing layer (20) and the top surface (26) of the rigid layer (25); wherein the hot melt adhesive (23) bonds the polishing layer (20) to the rigid layer (25); optionally, a pressure sensitive platen adhesive (70); wherein the pressure sensitive platen adhesive (70) is disposed on the bottom surface (27) of the rigid layer (25) (preferably, wherein the pressure sensitive platen adhesive facilitates mounting of the chemical mechanical polishing pad on a polishing machine); and, optionally, a release liner (75); wherein the pressure sensitive platen adhesive (70) is interposed between the bottom surface (27) of the rigid layer (25) and the release liner (75); wherein the polishing layer (20) comprises the reaction product of ingredients, comprising: a polishing layer prepolymer, wherein the polishing layer prepolymer is selected from the group consisting of isocyanate terminated urethane prepolymers having 2 to 12 wt % (preferably, 2 to 10 wt %; more preferably, 4 to 8 wt %; most preferably 5 to 7 wt %) unreacted NCO groups; and, a polishing layer curative system, comprising: at least 5 wt % (preferably 5 to 30 wt %; more preferably 5 to 25 wt %; most preferably 5 to 20 wt %) of a polishing layer amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule; 25 to 95 wt % (preferably, 35 to 90 wt %; more preferably, 50 to 75 wt %; most preferably, 60 to 75 wt %) of a polishing layer high molecular weight polyol curative having a number average molecular weight, $M_N$, of 2,500 to 100,000 (preferably, 5,000 to 50,000; more preferably, 7,500 to 25,000; most preferably, 10,000 to 15,000) and an average of three to ten (preferably, four to eight; more preferably, five to seven; most preferably, six) hydroxyl groups per molecule; and, 0 to 70 wt % (preferably, 5 to 60 wt %; more preferably, 10 to 50 wt %; still more preferably, 10 to 30 wt %; most preferably, 10 to 20 wt %) of a polishing layer difunctional curative; wherein the endpoint detection window (30) comprises a reaction product of ingredients, comprising: a window prepolymer, wherein the window prepolymer is selected from the group consisting of isocyanate terminated urethane prepolymers having 2 to 6.5 wt % (preferably, 3 to 6 wt %; more preferably, 5 to 6 wt %; most preferably, 5.5 to 6 wt %) unreacted NCO groups; and, a window curative system, comprising: at least 5 wt % (preferably, 5 to 70 wt %; more preferably, 10 to 60 wt %; most preferably, 20 to 40 wt %) of a window difunctional curative; at least 5 wt % (preferably, 5 to 25 wt %; more preferably, 5 to 20 wt %; most preferably, 5 to 15 wt %) of a window amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule; and, 25 to 90 wt % (preferably, 35 to 90 wt %; more preferably, 40 to 75 wt %; most preferably, 50 to 65 wt %) of a window high molecular weight polyol curative having a number average molecular weight, $M_N$, of 2,000 to 100,000 (preferably 2,500 to 100,000; more preferably 5,000 to 50,000; most preferably 7,500 to 15,000) and an average of three to ten (preferably, four to eight; more preferably, five to seven; most preferably, six) hydroxyl groups per molecule; wherein the polishing layer exhibits a density of $\geq 0.6$ g/cm$^3$ (preferably, 0.6 to 1.2 g/cm$^3$; more preferably 0.7 to 1.1 g/cm$^3$; most preferably 0.75 to 1.0 g/cm$^3$); a Shore D hardness of 5 to 40 (preferably 5 to 30; more preferably 5 to 20; most preferably 5 to 15); an elongation to break of 100 to 450% (preferably 125 to 425%; more preferably 150 to 300%; most preferably 150 to 200%); and, a cut rate of 25 to 150 µm/hr (preferably 30 to 125 µm/hr; more preferably 30 to 100 µm/hr; most preferably 30 to 60 µm/hr); and, wherein the polishing layer exhibits a density of $\geq 0.6$ g/cm$^3$ (preferably, 0.6 to 1.2 g/cm$^3$; more preferably 0.7 to 1.1 g/cm$^3$; most preferably 0.75 to 1.0 g/cm$^3$); a Shore D hardness of 5 to 40 (preferably 5 to 30; more preferably 5 to 20; most preferably 5 to 15); an elongation to break of 100 to 450% (preferably 125 to 425%; more preferably 150 to 300%; most preferably 150 to 200%); and, a cut rate of 25 to 150 µm/hr (preferably 30 to 125 µm/hr; more preferably 30 to 100 µm/hr; most preferably 30 to 60 µm/hr). (See FIGS. 1-6).

Isocyanate terminated urethane prepolymers for use as the polishing layer prepolymer and as the window prepolymer preferably comprise: a reaction product of ingredients, comprising: a polyfunctional isocyanate and a prepolymer polyol.

Polyfunctional isocyanate used in the preparation of the isocyanate terminated urethane prepolymers is preferably selected from the group consisting of aliphatic polyfunctional isocyanates, aromatic polyfunctional isocyanates, and mixtures thereof. More preferably, the polyfunctional isocyanate is a diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof. Most preferably, the polyfunctional isocyanate is a diisocyanate selected from the group consisting of 2,4-toluene diisocyanate; 2,6-toluene diisocyanate; and, mixtures thereof.

Prepolymer polyol used in the preparation of the isocyanate terminated urethane prepolymers is preferably selected from the group consisting of diols, polyols, polyol diols, copolymers thereof, and mixtures thereof. More preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Most preferably, the prepolymer polyol includes PPG mixed with at least one of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol.

Examples of commercially available PTMEG based isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Examples of commercially available PPG based isocyanate terminated urethane prepolymers include Imuthane® prepolymers (available from COIM USA, Inc., such as, PPT-80A, PPT-90A, PPT-95A, PPT-65D, PPT-75D); Adiprene® prepolymers (available from Chemtura, such as, LFG 963A, LFG 964A, LFG 740D); and, Andur® prepolymers (available from Anderson Development Company, such as, 8000APLF, 9500APLF, 6500DPLF, 7501DPLF).

Non-TDI based isocyanate terminated urethane prepolymers can also be used. For example, isocyanate terminated urethane prepolymers include those formed by the reaction of 4,4'-diphenylmethane diisocyanate (MDI) and polyols such as polytetramethylene glycol (PTMEG) with optional diols such as 1,4-butanediol (BDO) are acceptable. When such isocyanate terminated urethane prepolymers are used, the unreacted isocyanate (NCO) concentration is preferably 4 to 10 wt % (more preferably 4 to 8 wt %, most preferably 5 to 7 wt %). Examples of commercially available isocyanate terminated urethane prepolymers in this category include Imuthane® prepolymers (available from COIM USA, Inc. such as 27-85A, 27-90A, 27-95A); Andur® prepolymers (available from Anderson Development Company, such as, IE75AP, IE80AP, IE 85AP, IE90AP, IE95AP, IE98AP); and, Vibrathane® prepolymers (available from Chemtura, such as, B625, B635, B821).

The polishing layer prepolymer and the window prepolymer are preferably selected from isocyanate terminated urethane prepolymers having less than 0.1 wt % free toluene diisocyanate (TDI) monomer content.

The polishing layer prepolymer and the window prepolymer are preferably selected from isocyanate terminated urethane prepolymers having an average of two reactive isocyanate groups (i.e., NCO) per molecule.

The polishing layer difunctional curative and the window difunctional curative are preferably each independently selected from the group consisting of difunctional diol curatives and difunctional diamine curatives. More preferably, the polishing layer difunctional curative and the window difunctional curative are each independently selected from the group consisting of diethyltoluenediamine (DETDA); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) (MCDEA); polytetramethyleneoxide-di-p-aminobenzoate; N,N'-dialkyl-diamino diphenyl methane; p,p'-methylene dianiline (MDA); m-phenylenediamine (MPDA); 4,4'-methylene-bis-(2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3'-tetrachloro diamino diphenylmethane; trimethylene glycol di-p-aminobenzoate; and mixtures thereof. Still more preferably, the polishing layer difunctional curative and the window difunctional curative are each independently selected from the group consisting of 4,4'-methylene-bis-(2-chloroaniline) (MBOCA); 4,4'-methylene-bis-(3-chloro-2,6-diethylaniline) (MCDEA); and, isomers thereof. Most preferably, the polishing layer difunctional curative and the window difunctional curative are each 4,4'-methylene-bis-(2-chloroaniline) (MBOCA).

The polishing layer amine initiated curative and the window amine initiated curative are preferably each independently selected from the group consisting of amine initiated polyol curatives having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule. The amine initiated polyol curatives from which the polishing layer amine initiated curative and the window amine initiated curative are selected preferably have a number average molecular weight, $M_N$, of ≤700 (more preferably, 150 to 650; still more preferably, 200 to 500; most preferably, 250 to 300).

The amine initiated polyol curatives from which the polishing layer amine initiated curative and the window amine initiated curative are selected preferably have a hydroxyl number (as determined by ASTM Test Method D4274-11) of 350 to 1,200 mg KOH/g (more preferably, 400 to 1,000 mg KOH/g; most preferably, 600 to 850 mg KOH/g).

Examples of commercially available amine initiated polyol curatives include the Voranol® family of amine initiated polyols (available from The Dow Chemical Company); the Quadrol® Specialty Polyols (N,N,N',N'-tetrakis (2-hydroxypropyl ethylene diamine))(available from BASF); Pluracol® amine based polyols (available from BASF); Multranol® amine based polyols (available from Bayer MaterialScience LLC); triisopropanolamine (TIPA) (available from The Dow Chemical Company); and, triethanolamine (TEA) (available from Mallinckrodt Baker Inc.). A number of preferred amine initiated polyol curatives are listed in TABLE 1.

TABLE 1

| Amine initiated polyol curative | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |

TABLE 1-continued

| Amine initiated polyol curative | Number of OH groups per molecule | $M_N$ | Hydroxyl Number (mg KOH/g) |
|---|---|---|---|
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

The polishing layer high molecular weight polyol curative and the window high molecular weight polyol curative are preferably each independently selected from the group of consisting of high molecular weight polyol curatives having an average of three to ten (more preferably, four to eight; still more preferably, five to seven; most preferably, six) hydroxyl groups per molecule.

The high molecular weight polyol curatives from which the polishing layer high molecular weight polyol curative is selected, preferably have a number average molecular weight, $M_N$, that is higher than the number average molecular weight, $M_N$, of the polishing layer amine initiated polyol curative used in the polishing layer curative system; and, preferably has a hydroxyl number that is lower than the hydroxyl number of the polishing layer amine initiated curative used in the polishing layer curative system. Preferably, the polishing layer high molecular weight polyol curative used in the formation of the polishing layer (20) has a number average molecular weight, $M_N$, of 2,500 to 100,000 (more preferably, 5,000 to 50,000; still more preferably, 7,500 to 25,000; most preferably, 10,000 to 15,000).

The high molecular weight polyol curatives from which the window high molecular weight polyol curative is selected, preferably have a number average molecular weight, $M_N$, that is higher than the number average molecular weight, $M_N$, of the window amine initiated polyol curative used in the window curative system; and, preferably has a hydroxyl number that is lower than the hydroxyl number of the window amine initiated curative used in the window curative system. Preferably, the window high molecular weight polyol curative used in the formation of the window (30) has a number average molecular weight, $M_N$, of 2,000 to 100,000 (more preferably, 2,500 to 100,000; still more preferably 5,000 to 50,000; most preferably, 7,500 to 15,000).

Examples of commercially available high molecular weight polyol curatives include Specflex® polyols, Voranol® polyols and Voralux® polyols (available from The Dow Chemical Company); Multranol® Specialty Polyols and Ultracel® Flexible Polyols (available from Bayer MaterialScience LLC); and Pluracol® Polyols (available from BASF). A number of preferred high molecular weight polyol curatives are listed in TABLE 2.

TABLE 2

| High molecular weight polyol curative | Number of OH groups per molecule | $M_N$ | Hydroxyl Number (mg KOH/g) |
|---|---|---|---|
| Multranol ® 3901 Polyol | 3.0 | 6,000 | 28 |
| Pluracol ® 1385 Polyol | 3.0 | 3,200 | 50 |
| Pluracol ® 380 Polyol | 3.0 | 6,500 | 25 |
| Pluracol ® 1123 Polyol | 3.0 | 7,000 | 24 |
| ULTRACEL ® 3000 Polyol | 4.0 | 7,500 | 30 |
| SPECFLEX ® NC630 Polyol | 4.2 | 7,602 | 31 |
| SPECFLEX ® NC632 Polyol | 4.7 | 8,225 | 32 |
| VORALUXO ® HF 505 Polyol | 6.0 | 11,400 | 30 |
| MULTRANOL ® 9185 Polyol | 6.0 | 3,366 | 100 |
| VORANOL ® 4053 Polyol | 6.9 | 12,420 | 31 |

Preferably, the sum of the reactive hydrogen groups (i.e., the sum of the amine ($NH_2$) groups and the hydroxyl (OH) groups) contained in the components of the polishing layer curative system divided by the unreacted isocyanate (NCO) groups in the polishing layer prepolymer (i.e., the stoichiometric ratio) used in the formation of the polishing layer (20) of the chemical mechanical polishing pad (10) of the present invention is 0.85 to 1.15 (more preferably 0.90 to 1.10; most preferably 0.95 to 1.05).

Preferably, the sum of the reactive hydrogen groups (i.e., the sum of the amine ($NH_2$) groups and the hydroxyl (OH) groups) contained in the components of the window curative system divided by the unreacted isocyanate (NCO) groups in the window prepolymer (i.e., the stoichiometric ratio) used in the formation of the endpoint detection window (30) of the chemical mechanical polishing pad (10) of the present invention is 0.7 to 1.2 (more preferably, 0.8 to 1.10; still more preferably, 0.95 to 1.05; most preferably, 0.98 to 1.02).

The polishing layer (20) optionally further comprises a plurality of microelements. Preferably, the plurality of microelements are uniformly dispersed throughout the polishing layer (20). Preferably, the plurality of microelements is selected from entrapped gas bubbles, hollow core polymeric materials, liquid filled hollow core polymeric materials, water soluble materials and an insoluble phase material (e.g., mineral oil). More preferably, the plurality of microelements is selected from entrapped gas bubbles and hollow core polymeric materials uniformly distributed throughout the polishing layer (20). Preferably, the plurality of microelements has a weight average diameter of less than 150 µm (more preferably of less than 50 µm; most preferably of 10 to 50 µm). Preferably, the plurality of microelements comprise polymeric microballoons with shell walls of either polyacrylonitrile or a polyacrylonitrile copolymer (e.g., Expancel® from Akzo Nobel). Preferably, the plurality of microelements are incorporated into the polishing layer (20) at 0 to 35 vol % porosity (more preferably 10 to 25 vol % porosity).

The polishing layer (20) can be provided in both porous and nonporous (i.e., unfilled) configurations. Preferably, the polishing layer (20) exhibits a density of ≥0.6 g/cm³ as measured according to ASTM D1622. More preferably, the polishing layer (20) exhibits a density of 0.6 to 1.2 g/cm³ (still more preferably 0.7 to 1.1 g/cm³; most preferably 0.75 to 1.0 g/cm³) as measured according to ASTM D1622.

Preferably, the polishing layer (20) exhibits a Shore D hardness of 5 to 40 as measured according to ASTM D2240. More preferably, the polishing layer (20) exhibits a Shore D hardness of 5 to 30 (still more preferably 5 to 20; most preferably 5 to 15) as measured according to ASTM D2240.

Polishing layers exhibiting a Shore D hardness of less than 40 typically have very high elongation to break values (i.e., >600%). Materials exhibiting such high elongation to break values reversibly deform when subjected to machining operations, which results in groove formation that is unacceptably poor and texture creation during diamond conditioning that is insufficient. The unique polishing layer curative system used in the formation of the polishing layer (20) of the chemical mechanical polishing pad (10) of the present invention provides a low hardness coupled with an elongation to break of 100 to 450% as measured according to ASTM D412. Preferably, the polishing layer (20) exhibits an elongation to break of 125 to 425% (still more preferably 150 to 300%; most preferably 150 to 200%) as measured according to ASTM D412.

Preferably, the polishing layer (20) exhibits a cut rate of 25 to 150 μm/hr as measured using the method described herein in the Examples. More preferably, the polishing layer (20) exhibits a cut rate of 30 to 125 μm/hr (still more preferably 30 to 100 μm/hr; most preferably 30 to 60 μm/hr) as measured using the method described herein in the Examples.

One of ordinary skill in the art will understand to select a polishing layer (20) having a thickness, $T_P$, suitable for use in a chemical mechanical polishing pad (10) for a given polishing operation. Preferably, the polishing layer (20) exhibits an average thickness, $T_{P-avg}$, along an axis (A) perpendicular to a plane (28) of the polishing surface (14). More preferably, the average thickness, $T_{P-avg}$, is 20 to 150 mils (more preferably 30 to 125 mils; most preferably 40 to 120 mils). (See FIGS. 2 and 5).

Preferably, the polishing surface (14) of the polishing layer (20) is adapted for polishing a substrate. Preferably, the polishing surface (14) is adapted for polishing a substrate selected from at least one of a magnetic substrate, an optical substrate and a semiconductor substrate (more preferably, a semiconductor substrate; most preferably, a semiconductor wafer). The polishing surface (14) of the polishing layer (20) preferably exhibits at least one of macrotexture and microtexture to facilitate polishing the substrate. Preferably, the polishing surface (14) exhibits macrotexture, wherein the macrotexture is designed to do at least one of (i) alleviate at least one of hydroplaning; (ii) influence polishing medium flow; (iii) modify the stiffness of the polishing layer; (iv) reduce edge effects; and, (v) facilitate the transfer of polishing debris away from the area between the polishing surface (14) and the substrate being polished.

The polishing surface (14) preferably exhibits macrotexture selected from at least one of perforations and grooves. Preferably, the perforations can extend from the polishing surface (14) part way or all of the way through the thickness of the polishing layer (20). Preferably, the grooves are arranged on the polishing surface (14) such that upon rotation of the pad (10) during polishing, at least one groove sweeps over the substrate. Preferably, the grooves are selected from curved grooves, linear grooves and combinations thereof. The grooves exhibit a depth of ≥10 mils (preferably, 10 to 150 mils). Preferably, the grooves form a groove pattern that comprises at least two grooves having a combination of a depth selected from ≥10 mils, ≥15 mils and 15 to 150 mils; a width selected from ≥10 mils and 10 to 100 mils; and a pitch selected from ≥30 mils, ≥50 mils, 50 to 200 mils, 70 to 200 mils, and 90 to 200 mils.

Preferably, the polishing layer (20) contains <1 ppm abrasive particles incorporated therein.

The endpoint detection window (30) of the chemical mechanical polishing pad (10) of the present invention preferably exhibits a density of ≥1 g/cm³ (preferably, 1.05 to 1.2 g/cm³; more preferably 1.1 to 1.2 g/cm³; most preferably 1.1 to 1.15 g/cm³); a porosity of less than 0.1 vol %; a Shore D hardness of 10 to 50 (preferably, 15 to 45; more preferably, 20 to 40; most preferably, 25 to 35); and, an elongation to break of ≤400% (preferably, 150 to 400%; more preferably, 200 to 400%; most preferably, 250 to 400%).

The endpoint detection window (30) of the chemical mechanical polishing pad (10) of the present invention preferably exhibits a double pass transmission at 800 nm, $DPT_{800}$, of 30 to 100% (preferably, of 30 to 85%; more preferably, 50 to 85%; most preferably, 60 to 80%) as measured under the conditions set forth herein in the Examples. Preferably, the endpoint detection window (30) of the chemical mechanical polishing pad (10) of the present invention exhibits a $DPT_{800}$ of 30 to 100% (preferably, of 30 to 85%; more preferably, 50 to 85%; most preferably, 60 to 85%) as measured under the conditions set forth herein in the Examples; and, a double pass transmission at 400 nm, $DPT_{400}$, of 25 to 100% (preferably, of 25 to 85%; more preferably, 40 to 85%; most preferably, 45 to 85%) as measured under the conditions set forth herein in the Examples.

Preferably, the endpoint detection window (30) incorporated into the polishing layer in the chemical mechanical polishing pad (10) of the present invention is an integral window. (See FIG. 5). Methods for incorporating integral windows into polishing layers are well know.

The endpoint detection window (30) preferably exhibits a planarity of ±2.0 mils (more preferably, ±1.5 mils) with the polishing surface (14) of the polishing layer (20) after four hours of simulated substrate polishing at a polishing temperature of 40° C. (as described in the Examples). That is, the endpoint detection window (30) preferably exhibits a maximum bulge, or recess, of ≤2.0 mils (more preferably, ≤1.5 mils) away from the polishing surface (14) in a direction parallel to the axis B after four hours of simulated substrate polishing at a polishing temperature of 40° C. (as described in the Examples).

The endpoint detection window (30) has a thickness, $T_W$, along an axis B perpendicular to a plane (28) of the polishing surface (14). Preferably, the endpoint detection window (30) exhibits an average thickness, $T_{W-avg}$, that satisfies the following expression:

$$(T_{P-avg}-1\ \text{mil}) \leq T_{W-avg} \leq (T_{P-avg}+1\ \text{mil}).$$

More preferably, the endpoint detection window (30) preferably exhibits an average thickness, $T_{W-avg}$, that satisfies the following expression:

$$(T_{P-avg}-0.5\ \text{mil}) \leq T_{W-avg} \leq (T_{P-avg}+0.5\ \text{mil}).$$

Most preferably, endpoint detection window (30) preferably exhibits an average thickness, $T_{W-avg}$, that is equal to the average thickness of the polishing layer, $T_{P-avg}$.

Preferably, the rigid layer (25) is made of a material selected from the group consisting of a polymer, a metal, a reinforced polymer and combinations thereof. More preferably, the rigid layer (25) is made of a polymer. Most preferably, the rigid layer (25) is made of a polymer selected from the group consisting of a polyester, a nylon, an epoxy, a fiberglass reinforced epoxy; and, a polycarbonate (more preferably, a polyester; still more preferably, a polyethylene terephthalate polyester; most preferably, a biaxially oriented polyethylene terephthalate polyester).

Preferably, the rigid layer (25) has an average thickness of >5 to 60 mils (more preferably, 6 to 30 mils; still more preferably, 6 to 15 mils; most preferably, 6 to 10 mils).

Preferably, the top surface (26) and the bottom surface (27) of the rigid layer (25) are both ungrooved. More preferably, the top surface (26) and the bottom surface (27) are both smooth. Most preferably, the top surface (26) and the bottom surface (27) have a roughness, Ra, of 1 to 500 nm (preferably, 1 to 100 nm; more preferably, 10 to 50 nm; most preferably 20 to 40 nm) as determined using an optical profilometer.

Preferably, the rigid layer (25) exhibits a Young's Modulus, measured according to ASTM D882-12, of ≥100 MPa (more preferably, 1,000 to 10,000 MPa; still more preferably, 2,500 to 7,500 MPa; most preferably, 3,000 to 7,000 MPa).

Preferably, the rigid layer (25) exhibits a void fraction of <0.1 vol % (more preferably, <0.01 vol %).

Preferably, the rigid layer (25) is made of a biaxially oriented polyethylene terephthalate having an average thickness of >5 to 60 mils (preferably, 6 to 30 mils; more preferably, 6 to 15 mils; most preferably, 6 to 10 mils); and, a Young's Modulus, measured according to ASTM D882-12, of ≥100 MPa (preferably, 1,000 to 10,000 MPa; more preferably, 2,500 to 7,500 MPa; most preferably, 3,000 to 7,000 MPa).

Preferably, to facilitate polishing endpoint detection, the rigid layer (25) is either transparent to light at the detection wavelength (or wavelengths) of light for which the chemical mechanical polishing pad (10) of the present invention is designed; or has a through passage (35) in optical communication with the endpoint detection window (30). (See FIG. 5). The cross section of the through passage (35) in the rigid layer (25) perpendicular to the axis B can dimensionally correspond to, be larger than, or be smaller than, the cross section of the endpoint detection window (30) parallel to axis B. More preferably, for the chemical mechanical polishing pad (10) of the present invention, the cross section of the through passage (35) in the rigid layer (25) parallel to the axis B is dimensionally smaller than the cross section of the endpoint detection window (30). (See FIG. 5).

One of ordinary skill in the art will know how to select an appropriate hot melt adhesive (23) for use in the chemical mechanical polishing pad (10). Preferably, the hot melt adhesive (23) is a cured reactive hot melt adhesive. More preferably, the hot melt adhesive (23) is a cured reactive hot melt adhesive that exhibits a melting temperature in its uncured state of 50 to 150° C., preferably of 115 to 135° C. and exhibits a pot life of ≤90 minutes after melting. Most preferably, the hot melt adhesive (23) in its uncured state comprises a polyurethane resin (e.g., Mor-Melt™ R5003 available from Rohm and Haas Company).

The chemical mechanical polishing pad (10) is preferably adapted to be interfaced with a platen of a polishing machine. Preferably, the chemical mechanical polishing pad (10) is adapted to be affixed to the platen of a polishing machine. The chemical mechanical polishing pad (10) can be affixed to the platen using at least one of a pressure sensitive adhesive and vacuum.

Preferably, the chemical mechanical polishing pad (10) includes a pressure sensitive platen adhesive (70) applied to the bottom surface (27) of the rigid layer (25). One of ordinary skill in the art will know how to select an appropriate pressure sensitive adhesive for use as the pressure sensitive platen adhesive (70). Preferably, the chemical mechanical polishing pad (10) will also include a release liner (75) applied over the pressure sensitive platen adhesive (70), wherein the pressure sensitive platen adhesive (70) is interposed between the bottom surface (27) of the rigid layer (25) and the release liner (75). (See FIG. 2).

Optionally, the chemical mechanical polishing pad (10) of the present invention, further comprises: at least one additional layer interfaced with and interposed between the polishing layer (20) and the pressure sensitive platen adhesive layer (70). The at least one additional layer (not shown) can preferably be incorporated into the polishing pad (10) using an additional layer adhesive (not shown). The additional layer adhesive can be selected from pressure sensitive adhesives, hot melt adhesives, contact adhesives and combinations thereof. Preferably, the additional layer adhesive is a hot melt adhesive or a pressure sensitive adhesive. More preferably, the additional layer adhesive is a hot melt adhesive.

The method of the present invention for chemical mechanical polishing of a substrate preferably comprises: providing a chemical mechanical polishing apparatus having a platen, a light source and a photosensor (preferably a multisensor spectrograph); providing at least one substrate to be polished (preferably, wherein the substrate is selected from the group consisting of at least one of a magnetic substrate, an optical substrate and a semiconductor substrate; more preferable, wherein the substrate is a semiconductor substrate; most preferably, wherein the substrate is a semiconductor wafer); providing a chemical mechanical polishing pad of the present invention; installing onto the platen the chemical mechanical polishing pad; optionally, providing a polishing medium at an interface between a polishing surface of the chemical mechanical polishing pad and the substrate (preferably, wherein the polishing medium is selected from the group consisting of a polishing slurry and a non-abrasive containing reactive liquid formulation); creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor. Preferably, the polishing endpoint is determined based on an analysis of a wavelength of light reflected off the surface of the substrate and transmitted through the endpoint detection window, wherein the wavelength of light has a wavelength of >370 nm to 800 nm. More preferably, the polishing endpoint is determined based on an analysis of multiple wavelengths of light reflected off the surface of the substrate and transmitted through the endpoint detection window, wherein one of the wavelengths analyzed has a wavelength of >370 nm to 800 nm.

The method of polishing a substrate of the present invention, optionally, further comprises: periodically, conditioning of the polishing surface (14) with an abrasive conditioner.

Some embodiments of the present invention will now be described in detail in the following Examples.

Polishing Layer

Comparative Examples A-B and Examples 1-19

Polishing layers were prepared according to the formulation details provided in TABLE 3. Specifically, polyurethane cakes were prepared by the controlled mixing of the polishing layer prepolymer at 51° C. (i.e., the Adiprene® LF667 available from for Comparative Example A and Examples 1-9; and, the Adiprene® LFG963A for Comparative Example B and Examples 10-19; both available from Chemtura Corporation) with the components of the polishing layer curative system. The amine initiated polyol curative (i.e., the Voranol® 800 available from The Dow Chemical Company) and the high molecular weight polyol curative (i.e., the Voralux® HF505 available from The Dow Chemical Company) were premixed before blending in the other raw materials. All of the raw materials, except for MBOCA, were maintained at a premixing temperature of 51° C. The MBOCA was maintained at a premixing temperature of 116° C. The ratio of the polishing layer curative system to the polishing layer prepolymer was set such that the stoichiometry, as defined by the ratio of reactive hydrogen groups (i.e., the sum of the —OH groups and —NH$_2$ groups) in the curative system to the unreacted isocyanate (NCO) groups in the polishing layer prepolymer, was as noted in TABLE 3.

Porosity was introduced into the polishing layers by adding Expancel® microspheres to the polishing layer prepolymer prior to combining with the polishing layer curative system to achieve the desired porosity and density.

The polishing layer prepolymer with any incorporated Expancel® microspheres and the polishing layer curative system were mixed together using a high shear mix head. After exiting the mix head, the combination was dispensed over a period of 5 minutes into a 86.4 cm (34 inch) diameter circular mold to give a total pour thickness of approximately 10 cm (4 inches). The dispensed combination was allowed to gel for 15 minutes before placing the mold in a curing oven. The mold was then cured in the curing oven using the following cycle: 30 minutes ramp from ambient temperature to a set point of 104° C., then hold for 15.5 hours at 104° C., and then 2 hour ramp from 104° C. to 21° C.

The cured polyurethane cakes were then removed from the mold and skived (cut using a moving blade) at a temperature of 30 to 80° C. into approximately forty separate 2.0 mm (80 mil) thick sheets. Skiving was initiated from the top of each cake. Any incomplete sheets were discarded.

Note that Adiprene® LF667 used in the Examples is a PTMEG based isocyanate terminated urethane prepolymer comprising a 50/50 weight percent blend of Adiprene® LF950A and Adiprene® LF600D available from Chemtura. Also note that Adiprene® LFG963A is a PPG based isocyanate terminated urethane prepolymer available from Chemtura.

according to ASTM D1622; the Shore D hardness data reported were determined according to ASTM D2240; the Shore A hardness data reported were determined according to ASTM D2240; and, the elongation to break data reported were determined according to ASTM D412.

The cut rate data reported in TABLE 4 were measured using a 200 mm Mirra® polishing tool from Applied Materials. This polishing tool is designed to accommodate a circular chemical mechanical polishing pad having a nominal diameter of 51 cm (20 inches). Polishing layers having a circular cross section were prepared as described herein in the Examples. These polishing layers were then machine grooved to provide a groove pattern in the polishing surface comprising a plurality of concentric circular grooves having dimensions of 120 mil (3.05 mm) pitch, 20 mil (0.51 mm) width and 30 mil (0.76 mm) depth. The polishing layers were then laminated to a foam sub-pad layer (SP2310 available from Rohm and Haas Electronic Materials CMP Inc.)

A diamond conditioning disk (DiaGrid® AD3CL-150840-3 pad conditioner manufactured by Kinik Company) was used to abrade the polishing surface of the grooved polishing layers using the following process conditions: the polishing surface of the polishing layers were subjected to continuous abrasion from the diamond conditioning disk for a period of 2 hours, with a platen speed of 100 rpm, a deionized water flow rate of 150 cm$^3$/min and a conditioning disk down force of 48.3 kPa (7 psi). The cut rate was determined by measuring the change in the average groove depth over time. The groove depth was measured (in μm/hour) using an MTI Instruments Microtrack II Laser Triangulation Sensor mounted on a Zaber Technologies Motorized Slide to profile the polishing surface of each polishing layer from the center to the outer edge. The sweep speed of the sensor on the slide was 0.732 mm/s and the sampling rate (measurements/mm of sweep) for the sensor was 6.34 points/mm. The cut rate

TABLE 3

| Ex # | Polishing layer prepolymer | Prepolymer % NCO | Polishing layer Curative System (wt %) | | | Stoich. (Active H/NCO) | Expancel® Pore Former | Pore Former wt % | Porosity vol % |
|---|---|---|---|---|---|---|---|---|---|
| | | | MBOCA | Voranol® 800 | Voralux® HF 505 | | | | |
| A | Adiprene® LF667 | 6.7 | 100 | 0 | 0 | 0.85 | 551DE40d42 | 1.8 | 35 |
| B | Adiprene® LFG963A | 5.8 | 100 | 0 | 0 | 0.9 | 551DE40d42 | 1.3 | 23 |
| 1 | Adiprene® LF667 | 6.7 | 0 | 25 | 75 | 0.97 | 920DE40d30 | 1.3 | 34 |
| 2 | Adiprene® LF667 | 6.7 | 67 | 8 | 25 | 0.97 | 920DE40d30 | 1.3 | 34 |
| 3 | Adiprene® LF667 | 6.7 | 0 | 14 | 86 | 1.0 | 551DE40d42 | 1.4 | 29 |
| 4 | Adiprene® LF667 | 6.7 | 14 | 12 | 74 | 1.0 | 551DE40d42 | 1.4 | 29 |
| 5 | Adiprene® LF667 | 6.7 | 25 | 11 | 64 | 1.0 | 551DE40d42 | 1.4 | 28 |
| 6 | Adiprene® LF667 | 6.7 | 25 | 11 | 64 | 1.0 | 551DE40d42 | 0.6 | 15 |
| 7 | Adiprene® LF667 | 6.7 | 40 | 9 | 51 | 1.0 | 551DE40d42 | 1.4 | 28 |
| 8 | Adiprene® LF667 | 6.7 | 50 | 7 | 43 | 1.0 | 551DE40d42 | 1.6 | 32 |
| 9 | Adiprene® LF667 | 6.7 | 50 | 7 | 43 | 1.0 | 551DE40d42 | 0.7 | 18 |
| 10 | Adiprene® LFG963A | 5.8 | 14 | 12 | 74 | 1.0 | 551DE20d60 | 2.0 | 28 |
| 11 | Adiprene® LFG963A | 5.8 | 33 | 10 | 57 | 1.0 | 551DE20d60 | 2.0 | 28 |
| 12 | Adiprene® LFG963A | 5.8 | 14 | 12 | 74 | 1.0 | 551DE20d60 | 1.4 | 22 |
| 13 | Adiprene® LFG963A | 5.8 | 33 | 10 | 57 | 1.0 | 551DE20d60 | 1.5 | 23 |
| 14 | Adiprene® LFG963A | 5.8 | 41 | 8 | 51 | 1.0 | 551DE20d60 | 1.4 | 22 |
| 15 | Adiprene® LFG963A | 5.8 | 33 | 10 | 57 | 1.0 | — | — | — |
| 16 | Adiprene® LFG963A | 5.8 | 0 | 25 | 75 | 1.0 | 551DE20d60 | 2.0 | 28 |
| 17 | Adiprene® LFG963A | 5.8 | 0 | 14 | 86 | 1.0 | 551DE20d60 | 1.8 | 26 |
| 18 | Adiprene® LFG963A | 5.8 | 25 | 19 | 56 | 1.0 | 551DE40d42 | 1.6 | 32 |
| 19 | Adiprene® LFG963A | 5.8 | 25 | 19 | 56 | 1.0 | 551DE40d42 | 0.7 | 17 |

The ungrooved, polishing layer materials from each of Comparative Examples A-B and Examples 1-19 were analyzed to determine their physical properties as reported in TABLE 4. Note that the density data reported were determined reported in TABLE 4 is the arithmetic average reduction in groove depth over time, based on the collected thickness measurements taken as >2,000 points across the polishing surface of the polishing layer.

TABLE 4

| Ex. # | Density (g/cm³) | Shore Hardness A | Shore Hardness D | G' @ 30° C. (MPa) | G' @ 40° C. (MPa) | G" @ 40° C. (MPa) | G' @ 30° C./ G' @ 90° C. (MPa) | Tensile strength (MPa) | Elongation to break (%) | Tensile modulus (MPa) | Toughness (MPa) | Cut rate (μm/hr) |
|---|---|---|---|---|---|---|---|---|---|---|---|---|
| A | 0.78 | 93 | 43 | — | 44.0 | 2.6 | 1.4 | 17 | 191 | 65 | 24 | 34 |
| B | 0.88 | 91 | 41 | — | 49.0 | 3.2 | 1.9 | 15 | 293 | 95 | 62 | 26 |
| 1 | 0.76 | 56 | 10 | 3.2 | 3.1 | 0.1 | 1.0 | 3 | 161 | 4 | 3 | — |
| 2 | 0.76 | 83 | 35 | 27.8 | 24.2 | 2.7 | 1.4 | 16 | 250 | 46 | 23 | — |
| 3 | 0.81 | 48 | 7 | 2.2 | 2.2 | 0.1 | 1.1 | 2 | 160 | 3 | 2 | 72 |
| 4 | 0.81 | 57 | 11 | 4.6 | 3.8 | 0.5 | 1.5 | 5 | 294 | 5 | 9 | 41 |
| 5 | 0.82 | 62 | 18 | 9.0 | 8.2 | 0.9 | 1.3 | 7 | 360 | 13 | 15 | — |
| 6 | 0.98 | 61 | 17 | 5.0 | 4.6 | 0.5 | 1.1 | 8 | 414 | 7 | 16 | — |
| 7 | 0.82 | 75 | 23 | 16.8 | 15.6 | 1.4 | 1.3 | 11 | 346 | 26 | 22 | 30 |
| 8 | 0.79 | 79 | 27 | 21.4 | 19.7 | 1.6 | 1.4 | 12 | 332 | 36 | 26 | 29 |
| 9 | 0.95 | 83 | 31 | 23.2 | 21.5 | 1.9 | 1.2 | 16 | 351 | 40 | 34 | — |
| 10 | 0.83 | 56 | 10 | 6.0 | 4.5 | 0.9 | 2.8 | 4 | 189 | 6 | 5 | 46 |
| 11 | 0.82 | 75 | 23 | 18.6 | 13.4 | 3.0 | 6.0 | 7 | 256 | 31 | 13 | — |
| 12 | 0.90 | 61 | 14 | 8.2 | 6.4 | 1.2 | 3.1 | 4 | 164 | 8 | 4 | — |
| 13 | 0.88 | 72 | 21 | 18.1 | 13.8 | 3.1 | 5.1 | 7 | 288 | 24 | 15 | — |
| 14 | 0.89 | 77 | 25 | 23.6 | 18.7 | 3.8 | 5.2 | 9 | 291 | 33 | 18 | 43 |
| 15 | 1.14 | 78 | 27 | 21.2 | 15.6 | 3.7 | 4.7 | 10 | 293 | 23 | 18 | — |
| 16 | 0.83 | 55 | 10 | 5.6 | 4.5 | 0.7 | 2.0 | 3 | 162 | 4 | 3 | — |
| 17 | 0.85 | 57 | 11 | 4.6 | 4.0 | 0.4 | 1.7 | 3 | 143 | 4 | 2 | — |
| 18 | 0.78 | 70 | 19 | 18.0 | 13.3 | 2.6 | 4.7 | 5 | 173 | 23 | 7 | — |
| 19 | 0.96 | 73 | 20 | 17.9 | 12.5 | 2.9 | 5.4 | 7 | 232 | 23 | 11 | — |

Window

Comparative Examples C1-C24 and Examples 20-31

Endpoint detection windows were prepared according to the formulation details provided in TABLE 5. Specifically, the window prepolymer was mixed with the components of the window curative system using a vortex mixer at 1,000 rpm for 30 seconds. All of the raw materials, except for the difunctional aromatic curative (i.e., MBOCA and MCDEA), were maintained at a premixing temperature of 60° C. The MBOCA and MCDEA when used were maintained at a premixing temperature of 120° C.

The stoichiometric ratio between the window prepolymer and the window curative system used for the endpoint detections windows is provided in TABLE 5 as the ratio of the reactive hydrogen groups (i.e., the sum of the —OH groups and —NH₂ groups) in the window curative system to the unreacted isocyanate (NCO) groups in the window prepolymer.

In each of Comparative Examples C1-C24 and Examples 20-31, the window prepolymer and the window curative system were mixed together using a high shear mix head. After exiting the mix head, the combination was dispensed into a pocket mold with dimensions of 2 mm×125 mm×185 mm. The pocket mold with the dispensed combination was then cured in an oven for eighteen (18) hours. The set point temperature for the oven was initially set at 93° C. for the first twenty (20) minutes; 104° C. for the following fifteen (15) hours and forty (40) minutes; and then dropped to 21° C. for the final two (2) hours. The pocket mold and its contents was then removed the oven and the product endpoint detection window was then removed from the pocket mold.

TABLE 5

| Ex # | Window pre-polymer | (% NCO) | aromatic curative (P1) | P1 (wt %) | High MW curative (P2) | P2 (wt %) | Amine initiated curative (P3) | P3 (wt %) | Non-amine curative (P4) | P4 (wt %) | Stoich. (Active H/NCO) |
|---|---|---|---|---|---|---|---|---|---|---|---|
| C1 | A | 6.67 | MbOCA | 14.20 | H | 73.41 | J | 12.39 | — | — | 1.0 |
| C2 | A | 6.67 | MbOCA | 12.39 | H | 75.22 | J | 12.39 | — | — | 1.0 |
| C3 | A | 6.70 | MbOCA | 14.16 | H | 73.49 | J | 12.35 | — | — | 1.0 |
| C4 | A | 6.70 | MbOCA | 33.33 | H | 57.25 | J | 9.42 | — | — | 1.0 |
| C5 | C | 8.88 | MbOCA | — | H | 85.62 | J | 14.38 | — | — | 1.0 |
| C6 | C | 8.88 | MbOCA | — | I | 85.78 | J | 14.22 | — | — | 1.0 |
| C7 | B | 5.72 | MbOCA | — | H | 85.84 | J | 14.16 | — | — | 1.0 |
| C8 | D | 8.94 | MbOCA | — | H | 85.68 | J | 14.32 | — | — | 1.0 |
| C9 | D | 8.94 | MbOCA | — | I | 85.82 | J | 14.18 | — | — | 1.0 |
| C10 | A | 6.67 | MCDEA | — | I | 85.59 | J | 14.41 | — | — | 1.0 |
| C11 | A | 6.70 | MbOCA | — | H | 85.68 | J | 14.32 | — | — | 1.0 |
| C12 | G | 4.15 | MbOCA | 100 | — | — | — | — | — | — | 1.0 |
| C13 | B | 5.83 | MbOCA | 100 | — | — | — | — | — | — | 1.0 |
| C14 | E | 2.86 | MbOCA | 100 | — | — | — | — | — | — | 1.0 |
| C15 | F | 3.80 | MbOCA | 100 | — | — | — | — | — | — | 1.0 |
| C16 | B | 5.83 | MbOCA | 14.26 | H | 85.74 | — | — | — | — | 1.0 |
| C17 | B | 5.83 | MbOCA | 14.25 | I | 85.75 | — | — | — | — | 1.0 |
| C18 | B | 5.72 | MbOCA | 14.38 | H | 73.44 | — | — | K | 12.18 | 1.0 |
| C19 | B | 5.72 | MbOCA | 33.33 | H | 56.98 | — | — | K | 9.69 | 1.0 |
| C20 | A | 6.67 | MbOCA | 14.29 | H | 85.71 | — | — | — | — | 1.0 |

TABLE 5-continued

| | | | | | Window Curative System | | | | | |
|---|---|---|---|---|---|---|---|---|---|---|
| Ex # | Window pre-polymer | (% NCO) | aromatic curative (P1) | P1 (wt %) | High MW curative (P2) | P2 (wt %) | Amine initiated curative (P3) | P3 (wt %) | Non-amine curative (P4) | P4 (wt %) | Stoich. (Active H/NCO) |
| C21 | A | 6.67 | MbOCA | 14.29 | I | 85.71 | — | — | — | — | 1.0 |
| C22 | A | 6.70 | MbOCA | 14.37 | H | 73.52 | — | — | K | 12.11 | 1.0 |
| C23 | A | 6.70 | MbOCA | 33.22 | H | 57.09 | — | — | K | 9.69 | 1.0 |
| C24 | L | 8.95-9.25 | MbOCA | 100 | — | — | — | — | — | — | 1.05 |
| 20 | B | 5.83 | MbOCA | 14.24 | H | 73.51 | J | 12.25 | — | — | 1.0 |
| 21 | B | 5.83 | MbOCA | 14.15 | H | 73.54 | J | 12.31 | — | — | 1.0 |
| 22 | B | 5.72 | MbOCA | 14.38 | H | 73.24 | J | 12.38 | — | — | 1.0 |
| 23 | B | 5.72 | MbOCA | 33.33 | H | 57.32 | J | 9.35 | — | — | 1.0 |
| 24 | B | 5.83 | MbOCA | 14.24 | H | 73.51 | J | 12.25 | — | — | 1.0 |
| 25 | B | 5.83 | MbOCA | 14.24 | H | 77.15 | J | 8.61 | — | — | 0.84 |
| 26 | B | 5.83 | MCDEA | 14.29 | H | 79.12 | J | 6.59 | — | — | 1.0 |
| 27 | B | 5.83 | MbOCA | 21.94 | H | 66.91 | J | 11.15 | — | — | 1.0 |
| 28 | B | 5.83 | MbOCA | 31.76 | H | 58.43 | J | 9.81 | — | — | 1.0 |
| 29 | B | 5.83 | MbOCA | 43.67 | H | 48.47 | J | 7.86 | — | — | 1.0 |
| 30 | B | 5.83 | MbOCA | 58.33 | H | 35.78 | J | 5.89 | — | — | 1.0 |
| 31 | B | 5.83 | MbOCA | 14.24 | H | 79.14 | J | 6.62 | — | — | 0.76 |

A is Adiprene ® LF667 isocyanate terminated urethane prepolymer comprising a 50/50 weight percent blend of Adiprene ® LF950A and Adiprene ® LF600D available from Chemtura.
B is Adiprene ® LFG963A isocyanate terminated urethane prepolymer available from Chemtura Corporation.
C is Adiprene ® LFG740D isocyanate terminated urethane prepolymer available from Chemtura Corporation.
D is Adiprene ® LFG750D isocyanate terminated urethane prepolymer available from Chemtura Corporation.
E is Adiprene ® LF800A isocyanate terminated urethane prepolymer available from Chemtura Corporation.
F is Adiprene ® LF900A isocyanate terminated urethane prepolymer available from Chemtura Corporation.
G is Vibrathane ® B628 polyether based TDI-terminated prepolymer available from Chemtura Corporation.
H is Voralux ® HF505 high molecular weight polyol curative having a number average molecular weight, $M_N$, of 11,400 and an average of six hydroxyl groups per molecule available from The Dow Chemical Company.
I is polytetramethylene ether glycol having a number average molecular weight, $M_N$, of 2000 and an average of two hydroxyl groups per molecule available from Sigma-Aldrich.
J is Voranol ® 800 amine initiated polyol curative having a number average molecular, $M_N$, of 280 and an average of four hydroxyl groups per molecule available from The Dow Chemical Company.
K is Voranol ® 230-660 non-amine containing polyol curative having a number average molecular, $M_N$, of 255 and an average of three hydroxyl groups per molecule available from The Dow Chemical Company.
L is Adiprene ® L 325 isocyanate terminated urethane prepolymer available from Chemtura Corporation.

The endpoint detection windows prepared according to each of Comparative Examples C1-C23 and Examples 20-31 were analyzed to determine the physical properties as reported in TABLE 6.

The $DPT_{400}$ and $DPT_{800}$ transmission data reported for the endpoint detection windows was determined using the following equation:

$$DPT = (IW_{Si} - IW_D) \div (IA_{Si} - IA_D)$$

wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light at a given wavelength (i.e., at 400 nm and 800 nm, respectively) through the thickness, $T_W$, of the window and measuring at the point of origin the intensity of light of the given wavelength reflected back through the thickness of the window, $T_W$, from a surface positioned against a second face of the endpoint detection window substantially parallel to the first face; wherein $IW_{Si}$ is a measurement of the intensity of light at the given wavelength that passes through the window from the point of origin and reflects off the surface of a silicon blanket wafer placed against a second face of the window back through the window to the point of origin; wherein $IW_D$ is a measurement of the intensity of light at the given wavelength that passes from the point of origin through the window and reflects off the surface of a black body and back through the window to the point of origin; wherein $IA_{Si}$ is a measurement of the intensity of light at the given wavelength that passes from the point of origin through a thickness of air equivalent to the thickness, $T_W$, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light at the given wavelength reflected off a black body at the light emitting surface of the 3 mm fiber optic cable.

The density data reported for the endpoint detection windows was determined according to ASTM D1622.

The Shore D hardness data reported for the endpoint detection windows was determined according to ASTM D2240.

The tensile properties of the endpoint detection windows (i.e., tensile strength and elongation to break) were measured according to ASTM D1708-10 using an Alliance RT/5 mechanical tester available from MTS Systems Corporation as a crosshead speed of 2.54 cm/min. All tensile property testing was performed in a temperature and humidity controlled laboratory set at 23° C. and a relative humidity of 50%. All of the test samples were conditioned under the noted laboratory conditions for 5 days before performing the testing. The reported tensile strength (MPa) and elongation to break (%) for each endpoint detection window material were determined from stress-strain curves of four replicate samples.

TABLE 6

| Ex. # | DPT (in %) at 400 nm | DPT (in %) at 800 nm | Density (g/cm³) | Shore D Hardness (15 s) | Tensile strength (MPa) | Elongation to break (%) |
|---|---|---|---|---|---|---|
| C1  | 0  | 0  | 1.11 | 17 | 8.38  | 426 |
| C2  | 0  | 0  | 1.10 | 24 | 8.56  | 279 |
| C3  | 2  | 1  | 1.09 | 6  | 3.55  | 287 |
| C4  | 0  | 18 | 1.08 | 22 | 9.78  | 306 |
| C5  | 0  | 0  | 1.07 | 10 | 2.81  | 131 |
| C6  | 0  | 0  | 1.08 | 14 | 6.70  | 223 |
| C7  | 16 | 41 | 1.08 | 14 | 2.48  | 160 |
| C8  | 0  | 0  | 1.11 | 12 | 6.02  | 199 |
| C9  | 0  | 0  | 1.07 | 10 | 8.18  | 345 |
| C10 | 0  | 9  | 1.06 | 17 | 2.17  | 146 |
| C11 | 1  | 0  | 1.07 | 6  | 2.91  | 262 |
| C12 | 38 | 68 | 1.13 | 32 | 18.68 | 807 |
| C13 | 8  | 64 | 1.13 | 55 | 24.94 | 492 |
| C14 | 48 | 70 | 1.06 | 28 | 12.22 | 768 |
| C15 | 26 | 53 | 1.08 | 38 | 27.32 | 860 |
| C16 | 0  | 0  | 1.10 | 24 | 7.58  | 362 |
| C17 | 0  | 0  | 1.07 | 9  | 1.82  | 145 |
| C18 | 0  | 4  | 1.10 | 23 | 6.30  | 284 |
| C19 | 0  | 31 | 1.11 | 32 | 12.22 | 404 |
| C20 | 0  | 0  | 1.08 | 29 | 8.96  | 337 |
| C21 | 0  | 0  | 1.07 | 14 | 2.89  | 517 |
| C22 | 0  | 10 | 1.09 | 28 | 7.08  | 247 |
| C23 | 0  | 8  | 1.09 | 36 | 15.08 | 353 |
| 20  | 55 | 70 | 1.12 | 21 | 6.30  | 242 |
| 21  | 38 | 61 | 1.07 | 26 | 6.63  | 196 |
| 22  | 44 | 70 | 1.10 | 15 | 5.19  | 281 |
| 23  | 37 | 66 | 1.10 | 25 | 11.05 | 390 |
| 24  | 42 | 59 | 1.11 | 24 | 7.21  | 248 |
| 25  | 25 | 68 | 1.12 | 29 | 6.98  | 152 |
| 26  | 50 | 61 | 1.13 | 23 | 6.88  | 243 |
| 27  | 51 | 70 | 1.11 | 28 | 6.30  | 255 |
| 28  | 50 | 75 | 1.12 | 34 | 9.77  | 328 |
| 29  | 47 | 74 | 1.13 | 38 | 12.98 | 379 |
| 30  | 32 | 68 | 1.13 | 42 | 14.50 | 356 |
| 31  | 22 | 54 | 1.12 | 28 | 5.79  | 146 |

Endpoint Detection Window Bulge/Recess Evaluation

Window blocks were prepared according to the formulation and process described for each of Comparative Example C24 and Examples 8-11 with the exception that the pocket mold was replaced with a window block mold having a cavity with the dimensions of 5.7 cm×1.9 cm×10.2 cm. The window blocks obtained were incorporated into polishing pad cakes of identical composition by conventional means and polishing layers having integral endpoint detection windows and a $T_{P-avg}$ of 80 mils were skived from the resulting pad cakes to provide a control polishing layer with a conventional window formulation (Comparative Example C24) and polishing layers with the inventive window formulations (Examples 8-11). All of the polishing layers were 80 mils thick and had circular grooves that were 30 mils deep and 20 mils wide with a 120 mils pitch. All of the polishing layers were laminated onto a Suba IV™ subpad material. All of the polishing layers were subjected to four hours of simulated substrate polishing using an Applied Materials Mirra 200 mm polisher with full conditioning (i.e., conditioning only). Specifically, the pads were installed in the polisher and conditioned with a Saesol AK45 CMP conditioning disk (available from Saesol Diamond Ind. Co., Ltd.) with a conditioning down force of 48.3 kPa; deionized water at a flow rate of a flow rate of >300 ml/min; a table rotation speed of 99 rpm; a conditioner speed of 90 rpm. Following the four (4) hours of simulated substrate polishing under the noted conditions, the integral window profiles were measured at the polishing surface to determine the extent of any bulging outward of the window from the polishing surface or any recessing of the window away from the polishing surface. The maximum bulge or recess observed for each window is reported in TABLE 7.

TABLE 7

| Window of Example | Maximum Bulge/recess (in mils) |
|---|---|
| C24 | 29.2 |
| 8   | <1   |
| 9   | 1.3  |
| 10  | 1.5  |
| 11  | 1.0  |

We claim:

1. A chemical mechanical polishing pad, comprising:
a polishing layer having a polishing surface, a base surface and an average thickness, $T_{P-avg}$, measured in a direction perpendicular to the polishing surface from the polishing surface to the base surface; and,
an endpoint detection window incorporated into the polishing layer;
wherein the polishing layer comprises a reaction product of ingredients, comprising:
a polishing layer prepolymer, wherein the polishing layer prepolymer is selected from the group consisting of isocyanate terminated urethane prepolymers having 2 to 12 wt % unreacted NCO groups; and,
a polishing layer curative system, comprising:
at least 5 wt % of a polishing layer amine initiated polyol curative having at least one nitrogen atom per molecule and an average of at least three hydroxyl groups per molecule;
25 to 95 wt % of a polishing layer high molecular weight polyol curative having a number average molecular weight, $M_N$, of 2,500 to 100,000 and an average of three to ten hydroxyl groups per molecule; and,
0 to 70 wt % of a polishing layer difunctional curative;
wherein the endpoint detection window comprises a reaction product of ingredients, comprising:
a window prepolymer, wherein the window prepolymer is selected from the group consisting of isocyanate terminated urethane prepolymers having 2 to 6.5 wt % unreacted NCO groups; and,
a window curative system, comprising:
at least 5 wt % of a window difunctional curative;
at least 5 wt % of a window amine initiated polyol curative having at least one nitrogen atom per molecule and an average of at least three hydroxyl groups per molecule; and,
25 to 90 wt % of a window high molecular weight polyol curative having a number average molecular weight, $M_N$, of 2,000 to 100,000 and an average of three to ten hydroxyl groups per molecule;
wherein the polishing layer exhibits a density of ≥0.6 g/cm³; a Shore D hardness of 5 to 40; an elongation to break of 100 to 450%; and, a cut rate of 25 to 150 μm/hr.

2. The chemical mechanical polishing pad of claim 1, wherein the polishing surface is adapted for polishing a substrate selected from a magnetic substrate, an optical substrate and a semiconductor substrate.

3. The chemical mechanical polishing pad of claim 1, further comprising:
a rigid layer having a top surface and a bottom surface; and,
a hot melt adhesive interposed between the base surface of the polishing layer and the top surface of the rigid layer;

wherein the hot melt adhesive bonds the polishing layer to the rigid layer.

4. The chemical mechanical polishing pad of claim 3, further comprising:
a pressure sensitive platen adhesive; wherein the pressure sensitive platen adhesive is disposed on the bottom surface of the rigid; and,
a release liner; wherein the pressure sensitive platen adhesive is interposed between the bottom surface of the rigid layer and the release liner.

5. The chemical mechanical polishing pad of claim 1, wherein the window curative system has a reactive hydrogen moiety concentration and the window prepolymer has an unreacted NCO moiety concentration; and, wherein the reactive hydrogen moiety concentration divided by the unreacted NCO moiety concentration is 0.7 to 1.2.

6. The chemical mechanical polishing pad of claim 1, wherein the endpoint detection window exhibits a density of $\geq 1$ g/cm$^3$; a porosity of less than 0.1 vol %; a Shore D hardness of 10 to 50; an elongation to break of $\leq 400\%$; and, a double pass transmission at 800 nm, $DPT_{800}$, of 30 to 100%.

7. The chemical mechanical polishing pad of claim 6, wherein the endpoint detection window also exhibits a double pass transmission at 400 nm, $DPT_{400}$, of 25 to 100%.

8. The chemical mechanical polishing pad of claim 1, wherein the polishing layer curative system contains:
5 to 20 wt % of the polishing layer amine initiated polyol curative, wherein the polishing layer amine initiated polyol curative has two nitrogen atom per molecule, an average of four hydroxyl groups per molecule, and a number average molecular weight, $M_N$, of 200 to 400;
50 to 75 wt % of the polishing layer high molecular weight polyol curative, wherein the polishing layer high molecular weight polyol curative has a number average molecular weight, $M_N$, of 10,000 to 12,000; and an average of six hydroxyl groups per molecule;
10 to 30 wt % of the polishing layer difunctional curative; wherein the polishing layer difunctional curative is a diamine curative selected from the group consisting of 4,4'-methylene-bis-(2-chloroaniline) (MBOCA); 4,4'-methylene-bis-(3-chloro-2,6-diethylaniline) (MCDEA); and, isomers thereof;
wherein the polishing layer curative system has a plurality of reactive hydrogen moieties and the polishing layer prepolymer has a plurality of unreacted NCO moieties;
wherein the molar ratio of the reactive hydrogen moieties in the polishing layer curative system to unreacted isocyanate moieties in the polishing layer prepolymer is 0.95 to 1.05; and,
wherein the polishing layer exhibits a density of 0.75 to 1.0 g/cm$^3$; a Shore D hardness of 5 to 20; an elongation to break of 150 and 300%; and, a cut rate of 30 to 60 µm/hr.

9. The chemical mechanical polishing pad of claim 8, wherein the polishing layer prepolymer is selected from isocyanate terminated urethane prepolymers having 5 to 7 wt % unreacted NCO groups and exhibiting a number average molecular weight, $M_N$, of 400 to 2,500.

10. A method of polishing a substrate, comprising:
providing a chemical mechanical polishing apparatus having a platen, a light source and a photosensor;
providing at least one substrate;
providing a chemical mechanical polishing pad according to claim 1;
installing onto the platen the chemical mechanical polishing pad;
optionally, providing a polishing medium at an interface between the polishing surface and the substrate;
creating dynamic contact between the polishing surface and the substrate, wherein at least some material is removed from the substrate; and,
determining a polishing endpoint by transmitting light from the light source through the endpoint detection window and analyzing the light reflected off the surface of the substrate back through the endpoint detection window incident upon the photosensor.

11. The method of claim 10, wherein the at least one substrate is selected from the group consisting of at least one of a magnetic substrate, an optical substrate and a semiconductor substrate.

* * * * *